US008188734B1

(12) United States Patent
Abuelma'atti et al.

(10) Patent No.: US 8,188,734 B1
(45) Date of Patent: May 29, 2012

(54) 555 TIMER-BASED PHASE-TO-VOLTAGE CONVERTER

(75) Inventors: Muhammad Taher Abuelma'atti, Dhahran (SA); Husam Al-Shammari, Dhahran (SA)

(73) Assignee: King Fahd University of Petroleum & Minerals, Dhahran (SA)

( * ) Notice: Subject to any disclaimer, the term of this patent is extended or adjusted under 35 U.S.C. 154(b) by 0 days.

(21) Appl. No.: 13/069,151

(22) Filed: Mar. 22, 2011

(51) Int. Cl.
*G01V 3/00* (2006.01)

(52) U.S. Cl. ........................................ 324/300; 324/322

(58) Field of Classification Search .......... 324/300–322; 700/22, 286; 314/266; 327/170–175; 323/283; 318/266, 286, 434; 361/688, 687; 388/803, 388/800, 804, 816, 34
See application file for complete search history.

(56) References Cited

U.S. PATENT DOCUMENTS 4,170,747 A * 10/1979 Holmes .......................... 315/307
7,336,113 B2 * 2/2008 Laletin .......................... 327/175
7,466,176 B2 * 12/2008 Huard et al. .................. 327/172
7,489,975 B2 * 2/2009 Motomiya et al. .............. 700/22
2007/0139102 A1 6/2007 Laletin

FOREIGN PATENT DOCUMENTS

JP 58-182318 10/1983

OTHER PUBLICATIONS

"A new 555-timer based phase-to-voltage converter", Muhammad Taher Abuelma'atti and Husam Al-Shammari, www.electronicsworld. co.uk, Oct. 2010.

* cited by examiner

*Primary Examiner* — Brij Shrivastav
(74) *Attorney, Agent, or Firm* — Richard C. Litman

(57) ABSTRACT

The 555 timer-based phase-to-voltage converter is a circuit that can be used for phase-to-voltage conversion for phase angles in the range between 0 and $2\pi$. A first input signal triggers the 555 timer. A second input signal resets the 555 timer, and thus an output signal having a pulse width proportional to the phase difference between the first and second input signals is formed at the output of the 555 timer. A low pass filter may be placed at the output to pass a DC voltage having a magnitude proportional to the phase difference between the first and second input signals for phase angles between 0 and $2\pi$.

8 Claims, 2 Drawing Sheets

555 TIMER-BASED PHASE-TO-VOLTAGE CONVERTER

BACKGROUND OF THE INVENTION

1. Field of the Invention

The present invention relates generally to circuits for converting phase to voltage, and particularly to a 555 timer-based phase-to-voltage converter that uses a 555 timer operating in a monostable multivibrator mode.

2. Description of the Related Art

Phase-to-voltage converters are widely used in many instrumentation and measurement applications. Over the years many techniques have been developed for converting the phase angles between two pulse trains into voltage. In this regard, phase-to-voltage converters based on the "EXCLUSIVE OR" digital gate and the R-S flip-flop are two of the simplest techniques used. Despite its simplicity, the EXCLUSIVE OR based phase-to-voltage converter can provide a voltage linearly changing with phase angle for phase angles between 0 and $\pi$ only. While the R-S flip-flop based phase-to-voltage converter can provide a voltage that is linearly changing with the phase angle, by virtue of its operation, it cannot convert very small phase angles approaching 0°, or very large phase angles, approaching $2\pi$.

A simple phase-to-voltage circuit operable over the entire range of phase angles between 0° and 360° would be desirable. Thus, a 555 timer-based phase-to-voltage converter solving the aforementioned problems is proposed.

SUMMARY OF THE INVENTION

The 555 timer-based phase-to-voltage converter is a circuit that can be used for phase-to-voltage conversion for phase angles in the range between 0 and $2\pi$. A first input signal triggers the 555 timer. A second input signal resets the 555 timer, and thus an output signal having a width proportional to the phase difference between the first and second input signals is formed at the output of the 555 timer. A low pass filter may be placed at the output to pass a DC voltage of magnitude proportional to the phase difference between the first and second input signals for phase angles between 0 and $2\pi$.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
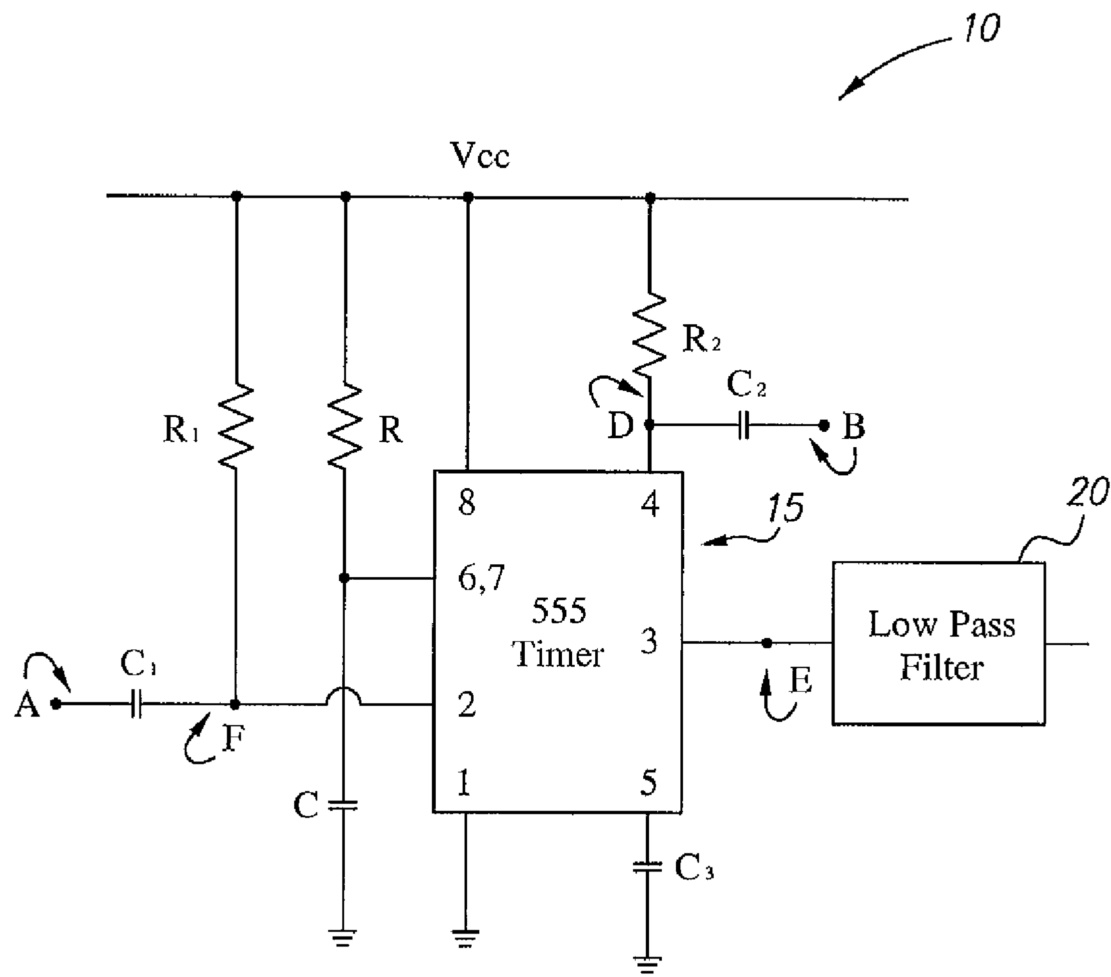
FIG. 1 is a schematic diagram of a 555-based phase-to-voltage converter according to the present invention.

The 555 timer-based phase-to-voltage converter 10, as shown in FIG. 1, comprises a 555-timer integrated circuit 15 configured in the monostable mode, i.e., a voltage at the node between the resistor R and the capacitor C of the RC charging circuit is applied to both the threshold pin (pin 6) and the discharge pin (pin 7). Normally, this produces a square wave output pulse at pin 3 that begins when a trigger pulse is applied to pin 2 and ends when the voltage across capacitor C reaches $\frac{2}{3}V_{CC}$. The pulse width has a period or time $\tau$ determined by $\tau=RC\ln3$, which is the time required for capacitor C to charge to $\frac{2}{3}V_{CC}$.

Figure 2:
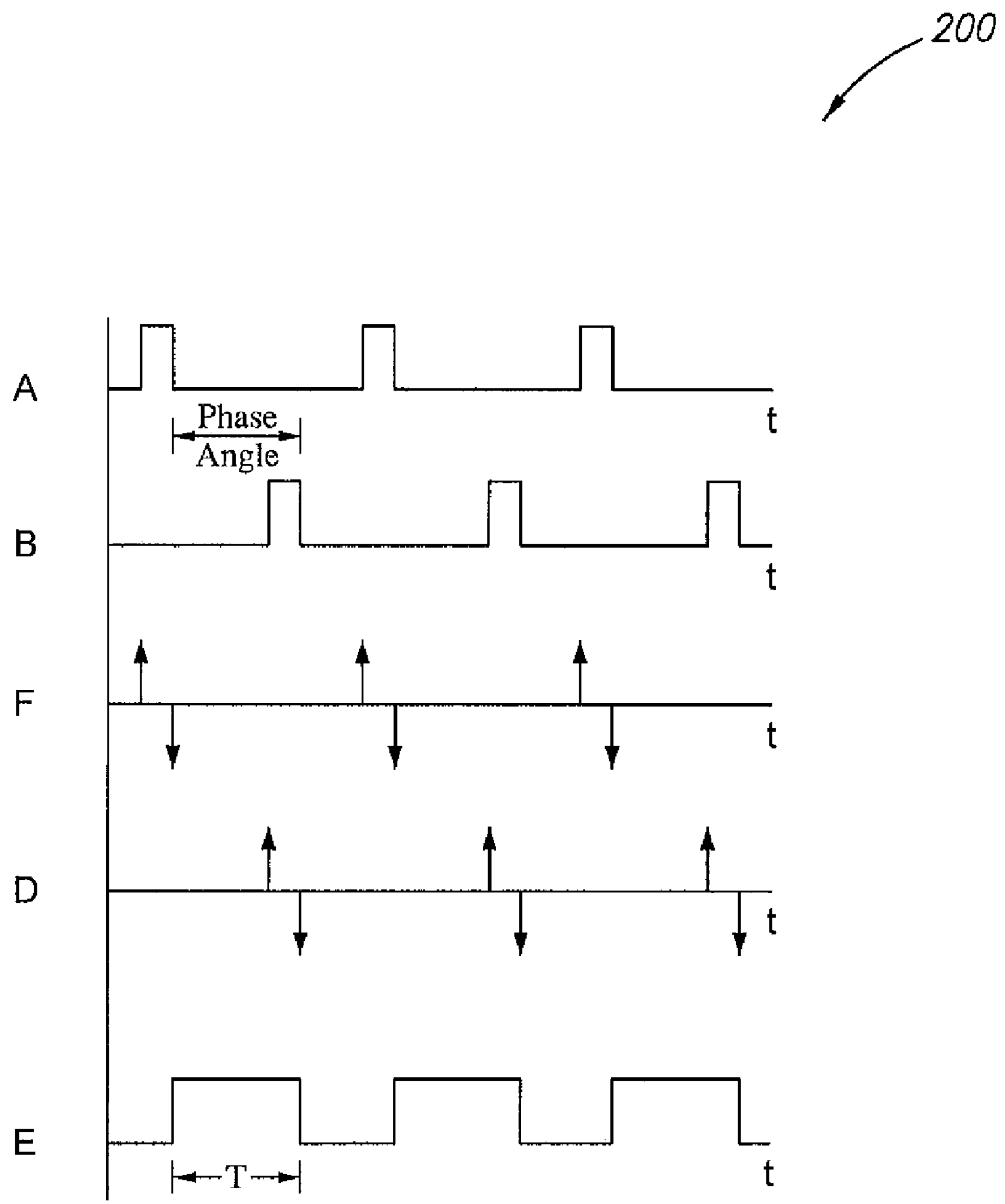
FIG. 2 is a plot showing the timing signals of the 555-based phase-to-voltage converter according to the present invention.

However, the phase-to-voltage converter 10 is configured to convert the phase angle between waveforms A and B, shown in plot 200 of FIG. 2, to a voltage, i.e., the output of the 555 timer integrated circuit 15 is a voltage pulse having a duration or period proportional to the phase angle difference between waveforms A and B. The $R_1$-$C_1$ portion of the phase-to-voltage converter electronic circuit 10 functions as a first differentiator. Thus, the voltage at node F is a first set of periodically repeating opposing impulse pairs or voltage spikes, as shown in waveform F in FIG. 2. Similarly, the $R_2$-$C_2$ portion of the phase-to-voltage converter electronic circuit 10 circuit functions as a second differentiator. Thus, the voltage at node D is a second set of periodically repeating opposing impulse pairs or voltage spikes, as shown in waveform D in FIG. 2. With respect to operations of the 555 timer integrated circuit 15, at the negative going edge of the voltage waveform A, the voltage at pin 2 (the trigger pin) is pulled to a value less than $V_{CC}/3$. Thus, the 555 timer integrated circuit 15 is triggered, and the capacitor C between pins 6 (and also pin 7) and ground starts a charging process heading towards $V_{CC}$, as long as the voltage at pin 4 (the reset pin) is large enough to enable the 555 timer integrated circuit 15, i.e., the latch is kept high (the flip-flop is not reset).

However, at the negative going edge of the voltage waveform B, the voltage at pin 4 is pulled down sufficiently to reset the 555 timer integrated circuit 15 and stop the charging process of capacitor C before capacitor C charges to $\frac{2}{3}V_{CC}$. Thus, the period of the resulting pulse at pin 3 (the output pin) is determined by the phase angle between the negative going edges or trailing edges of two consecutive pulses of the waveforms A and B. The preferred value of the RC time constant times the natural log of 3 ($\tau$=R*C*ln3) is always larger than the period of the pulse trains A and B. This is to guarantee that the width of the pulse at pin 3 is determined only by the phase angle between the two pulse trains A and B. A low pass filter (an RC circuit with the resistor in series with the output and a capacitor connected to ground) connected to pin 3 will produce a DC voltage that is linearly proportional to the phase angle between pulse trains A and B for values of phase angle between 0 and $2\pi$, since the capacitor in the low pass filter charges to a voltage proportional to the width of the pulse at output pin 3 of the 555 timer integrated circuit 15. A small capacitor, e.g., about 0.01 may connect the control pin (pin 5) to ground to eliminate noise. The 555 timer integrated circuit 15 is triggered and reset again by successive pulses of waveforms A and B to generate a periodic sequence of output pulses.

In FIG. 2, waveform A shows a first waveform input to the converter circuit 10. Waveform B shows a second waveform input to the converter circuit. Waveform F shows the voltage spikes produced at node F of the circuit of FIG. 1 by the R1-C1 differentiator, the voltage at node F being applied to the trigger pin 2 of the timer 15. Waveform D shows the voltage spikes produced at node D of FIG. 1 by the R2-C2 differentiator, the voltage at node D being applied to the reset pin 4 of the timer 15. Waveform E shows the output waveform from pin 3 of the timer 15, which shows that the output voltage is kept high for the period T corresponding to the phase angle defined between the trailing edges of waveforms A and B. The phase-to-voltage converter works for phase angles between 0° and 360°.

Although the 555 timer-based phase-to-voltage converter 10 has been illustrated with square waveform input signals A and B, the converter 10 may also be configured to work with input waveforms of negative polarity, in which case the phase angle is measured between the leading edges of the waveform inputs, and the trigger and reset pulses are supplied by the leading edges of the waveform inputs. Although the phase-to-voltage converter 10 has been illustrated with square waveform input signals A and B, the converter 10 may also be configured to work with sine wave or triangular wave input signals with suitable wave-shaper circuits to generate the trigger and reset signals.

It is to be understood that the present invention is not limited to the embodiments described above, but encompasses any and all embodiments within the scope of the following claims.

We claim:

1. A 555 timer-based phase-to-voltage converter, comprising:

a 555 timer integrated circuit;

an RC charging circuit for configuring the 555 timer integrated circuit in monostable multivibrator mode, the RC charging circuit having a resistor and a capacitor connected in series;

a first wave-shaping circuit for generating a trigger signal applied to the 555 timer integrated circuit, the trigger signal corresponding to a voltage transition in a first waveform input signal, the trigger signal switching output voltage of the 555 timer circuit high; and a second wave-shaping circuit for generating a reset signal applied to the 555 timer integrated circuit, the reset signal corresponding to a corresponding voltage transition in a second waveform input signal defining a phase angle between the first and second waveform input signals, the reset signal switching the output voltage of the 555 timer circuit low before the capacitor in the RC charging circuit charges to a threshold voltage of the 555 timer integrated circuit, the output voltage of the 555 timer integrated circuit defining an output pulse;

whereby the output pulse of the 555 timer integrated circuit has a period proportional to the phase angle between the first and second waveform input signals.

2. The 555 timer-based phase-to-voltage converter according to claim 1, wherein said first wave-shaping circuit comprises a differentiator circuit.

3. The 555 timer-based phase-to-voltage converter according to claim 1, wherein said first wave-shaping circuit comprises an RC differentiator circuit.

4. The 555 timer-based phase-to-voltage converter according to claim 1, wherein said second wave-shaping circuit comprises a differentiator circuit.

5. The 555 timer-based phase-to-voltage converter according to claim 1, wherein said second wave-shaping circuit comprises an RC differentiator circuit.

6. The 555 timer-based phase to voltage converter according to claim 1, further comprising a low pass filter, the output voltage of said 555 timer integrated circuit being applied to the low pass filter to pass a DC voltage of magnitude proportional to the phase angle between the first and second waveform input signals.

7. The 555 timer-based phase to voltage converter according to claim 1, wherein said RC charging circuit has an RC time constant selected so that the time required to charge the capacitor of the RC charging circuit to the threshold voltage of said 555 timer integrated circuit is greater than the period between the voltage transitions of the first and second waveform input signals defining the phase angle between the first and second waveform input signals.

8. A 555 timer-based phase-to-voltage converter, comprising:

a 555 timer integrated circuit;

an RC charging circuit for configuring the 555 timer integrated circuit in monostable multivibrator mode, the RC charging circuit having a resistor and a capacitor connected in series;

a first RC differentiator circuit for generating a trigger signal applied to the 555 timer integrated circuit, the trigger signal corresponding to a voltage transition in a first waveform input signal, the trigger signal switching output voltage of the 555 timer circuit high; and a second RC differentiator circuit for generating a reset signal applied to the 555 timer integrated circuit, the reset signal corresponding to a voltage transition in a second waveform input signal defining a phase angle between the first and second waveform input signals, the reset signal switching the output voltage of the 555 timer circuit low before the capacitor in the RC charging circuit charges to a threshold voltage of the 555 timer integrated circuit, the output voltage of the 555 timer integrated circuit defining an output pulse;

whereby the output pulse of the 555 timer integrated circuit has a period proportional to the phase angle between the first and second waveform input signals.

* * * * *